United States Patent
Boyko et al.

[19]

[11] Patent Number: 5,925,206
[45] Date of Patent: Jul. 20, 1999

[54] PRACTICAL METHOD TO MAKE BLIND VIAS IN CIRCUIT BOARDS AND OTHER SUBSTRATES

[75] Inventors: Chris M. Boyko; Donald S. Farquhar, both of Endicott; David Stone, Owego; Richard J. Supa, Lisle, all of N.Y.

[73] Assignee: International Business Machines Corporation, Armonk, N.Y.

[21] Appl. No.: 08/840,950

[22] Filed: Apr. 21, 1997

[51] Int. Cl.⁶ .................................................. H05K 3/32
[52] U.S. Cl. ............................................. 156/150; 29/852
[58] Field of Search ................................. 156/150, 151; 427/97; 29/852

[56] References Cited

U.S. PATENT DOCUMENTS

| | | | |
|---|---|---|---|
| 3,436,819 | 4/1969 | Lunine | 427/97 X |
| 3,672,986 | 6/1972 | Schneble, Jr. et al. | 427/97 X |
| 4,445,952 | 5/1984 | Reynolds, III et al. | 156/94 |
| 4,788,766 | 12/1988 | Burger et al. | 29/830 |
| 5,084,124 | 1/1992 | Taniguchi | 156/315 |
| 5,258,094 | 11/1993 | Furui et al. | 216/20 |
| 5,347,712 | 9/1994 | Yasuda et al. | 29/852 |
| 5,436,062 | 7/1995 | Schmidt et al. | 428/209 |
| 5,495,665 | 3/1996 | Carpenter et al. | 29/830 |

*Primary Examiner*—Francis J. Lorin
*Attorney, Agent, or Firm*—Whitham, Curtis & Whitham; Arthur J. Samodovitz

[57] ABSTRACT

A new method of preparing blind vias in printed circuit boards and other substrates allows for the drilling of holes for connection between conductive layers, in insulating layers prior to laminating insulating layers together. Each insulative layer is prepared with patterned conductive wiring and holes are drilled through the layer at points where wiring is to connect to another level of wiring. Two layers are aligned, using mechanical, optical, or other alignment mechanisms, and subsequently laminated together. The holes are plated with conductor after lamination to form an electrical connection. Additional layers can be added by the same method.

14 Claims, 3 Drawing Sheets

PRACTICAL METHOD TO MAKE BLIND VIAS IN CIRCUIT BOARDS AND OTHER SUBSTRATES

FIELD OF THE INVENTION

The present invention generally relates to printed circuit boards and, more particularly, to preparing vias for connection between multiple wiring layers in a substrate such as a circuit board.

BACKGROUND DESCRIPTION

The purpose of a via is to connect one conductor layer to another conductor layer in a printed circuit board or other substrate. The conductor layers are positioned between dielectric (insulating) layers.

One type of via is the plated through hole (PTH), in which a hole is drilled all the way through the circuit board. Following drilling through the circuit board the hole is plated with conductor. The conductor forms an electrical connection with each buried layer of conductor circuitry that it intersects. An example of a PTH is shown in FIG. 1A, which shows multiple layers of insulation 1 laminated together with layers of patterned conductor 2 between the insulation 1 layers. The detail of the patterned conductor 2 layers is not shown. To make connections between the patterned conductor 2 layers on different levels, a hole 3 is drilled through the laminated structure or formed by other suitable means. The hole 3 is plated with conductor 4 so that each layer of patterned conductor 2 may be electrically connected. If a connection is not desired between certain layers, the patterned conductor 2 must be relieved around the perimeter of the PTH. More than one PTH can be formed so that some conductor layers are connected by one PTH and other conductor layers are connected by another PTH. PTHs are simple to construct and are common in circuit boards. Capture pad 5 shows the typical geometry of the outermost conductive layer that a PTH intersects when no interconnection is required.

Another common structure is the buried via. A PTH can become a buried via if additional layers of insulating material are added to the structure on the top and bottom, so that the hole does not go through. Buried vias are also common, but are generally only found in more complex circuit boards consisting of multiple layers of dielectric and copper.

A cross section of a buried via is shown in FIG. 1B, where three layers of insulating material 11, 12, and 13, are laminated together. A buried via 14 is formed in the center of the middle insulating material layer 12. Middle insulating material 12 is also surrounded by patterned conductor layers 15 and 16 located on different levels in the multi-level structure. Although not shown, there could be patterned conductor layers below insulating material 11 and above insulating material 13. Buried via 14 is plated with conductor 17 to connect between patterned conductor layers 15 and 16. The buried via may or may not be filled with dielectric material as a result of subsequent lamination steps.

A third type of via is the "blind via", which is of another geometry and is generally found only in the most advanced circuit boards. While not necessarily complicated in terms of layers count, circuit boards can be characterized as advanced on the basis of having very fine features closely spaced together. For example, the state of the art for packaging integrated circuits is to mount them directly onto a very small, organic-based, printed circuit board as opposed to the traditional approach of mounting them onto a ceramic substrate. This approach is cheaper and better (organic materials used for making printed circuit boards have better dielectric properties than ceramic materials used for chip substrates). Blind vias are used in such high density printed circuit board applications because they save space and are suitable for making layer to layer connections thru even very thin insulating layers.

FIG. 1C shows a schematic cross sectional view of a blind via. There is shown a hole 21 plated with conductor 22 which terminates at patterned conducting layer 23. The plated hole 21 is surrounded by insulating material 24. Insulating material 24 is laminated to a partially completed printed circuit board consisting of patterned conductor 23 and dielectric layer 25. Additional conductor layers (not shown) and dielectric layers (not shown) can be connected to dielectric layer 25. Typically, conductor layers 27 and 26 would be patterned after lamination.

Contrasting a blind via with a PTH, a PTH would interfere with the circuitry which is represented in patterned conducting layer 26 shown in FIG. 1C. If blind via 21 was replaced by a PTH, the circuit layer 26 would have to be formed around the PTH. Furthermore, a capture pad would be required on layer 26, requiring additional space. Also, as a general rule, the deeper the hole, the larger its diameter must be for drilling, cleaning, and subsequent plating, therefore, taking up more space. Thus, a blind via saves space. The savings in space means higher density packaging which is electrically superior because all the circuit paths are shorter. Moreover, it can be less expensive to fabricate if greater integration is achieved.

There are three known methods to make blind vias. The first involves the use of a controlled depth drilling process. A conventional mechanical drill (widely used for hole making in printed circuit board fabrication) is used to make a partial depth hole. The problem with this approach is that for fine circuitry, the depth control is not precise enough. For example, with state of the art commercially available drill machines the depth control would be for example ±0.002 inches. This might be acceptable, but if the dielectric layers were 0.005 or less in thickness, these variations would be a significant fraction of the hole depth. In addition, a mechanical drill is not flat on the end; rather, it is pointed, thus making the bottom of the hole less uniform. In the case of very high frequency printed circuit boards, for example radio frequency, the geometric irregularity could cause electrical problems, acting as a tiny antenna when it protrudes as much as 0.004 inches further into a 0.005 inch dielectric layer than intended. Note that if the drill depth tolerance is ±0.002 inches, then the nominal drill depth must be set at 0.002 inches greater to ensure connection, resulting in a maximum of 0.004 inches protrusion.

A second process for making holes is laser ablation. This technique is growing in acceptance, but requires significant capital outlay, and is more suitable for some dielectric materials than others. A related process is the use of a mask next to the printed circuit board, the mask having holes corresponding to the desired hole locations, and the exposure to a plasma (ionized gas) that erodes the dielectric material. While there is prior art in this area, it is not widely practiced.

A third technique is referred to as surface laminar circuitry or SLC# (trademark of IBM Microelectronics). Here, a special dielectric material is used as the top layer of the circuit board. This layer is photo imageable, meaning that after it is applied it can be selectively polymerized by exposure to light and then developed such that portions remain only where the photo imageable layer was exposed to light. This technique can be used to form very small holes in the insulating layer that extend down to the next conductor layer.

Each of these three techniques are of interest in the industry, and reflect an industry wide effort to develop techniques to make micro vias. In each case the hole making process is different, but similar techniques are used to plate the hole with conductor after the hole is made to form the electrical interconnection.

SUMMARY OF THE INVENTION

It is therefore an object of the present invention to provide an improved method for forming blind holes in printed circuit boards.

The basic concept in this invention is that the vias in the top insulating layer are formed prior to lamination of one insulating layer to another insulating layer. After laminating the first and second layers, vias as individual cores in each layer are formed, and conductor layers are patterned. Multiple layers can be formed by taking a first insulating layer, printing a conductive layer pattern and laminating a second insulative layer having a patterned conductive layer which already has holes drilled through to the first insulative layer. The vias are plated to form an electrical connection between the conductors of the first and second layers, and the second insulative layer may then be patterned with a layer of conductive metal. Further insulating layers, in which holes have been pre-formed, may be added in the same manner. By forming holes in the insulative material prior to laminating it to partially fabricated printed circuit boards, the holes can be drilled as through holes. After the holes are drilled, the insulative material is aligned with respect to the partially built printed circuit board, and then laminated. The next step is copper plating to form the interconnection. It is acceptable for the holes to reduce in diameter during lamination. For example, a hole drilled 10 mils in diameter might be reduced to 5 mils after lamination, depending on the dielectric material properties.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 1A:
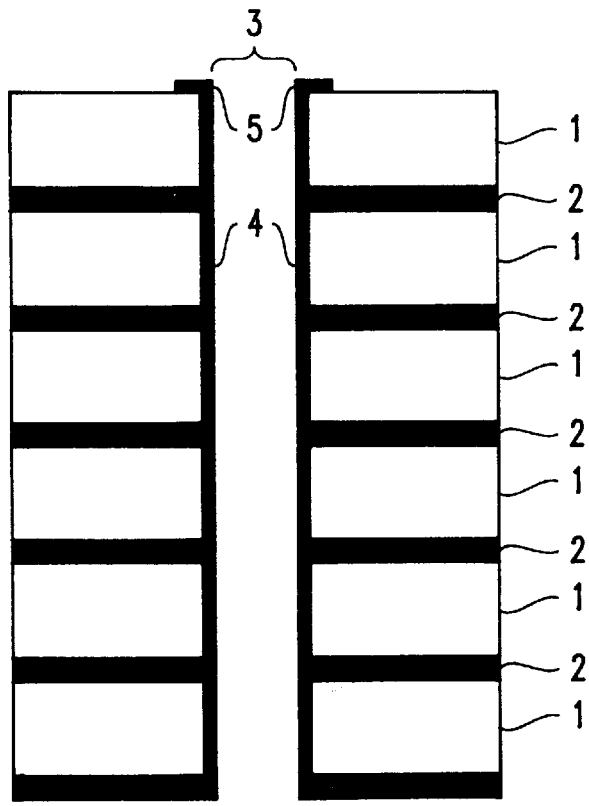
FIG. 1A is a schematic cross sectional view of a plated through hole.
Figure 1B:
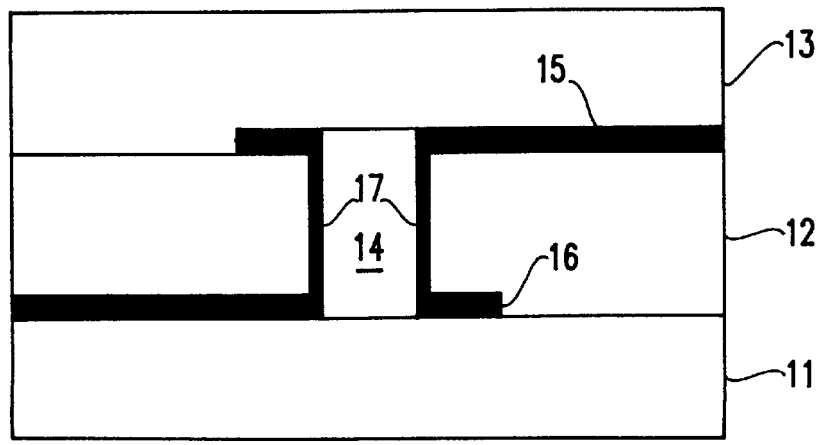
FIG. 1B is a schematic cross sectional view of a blind via.
Figure 1C:
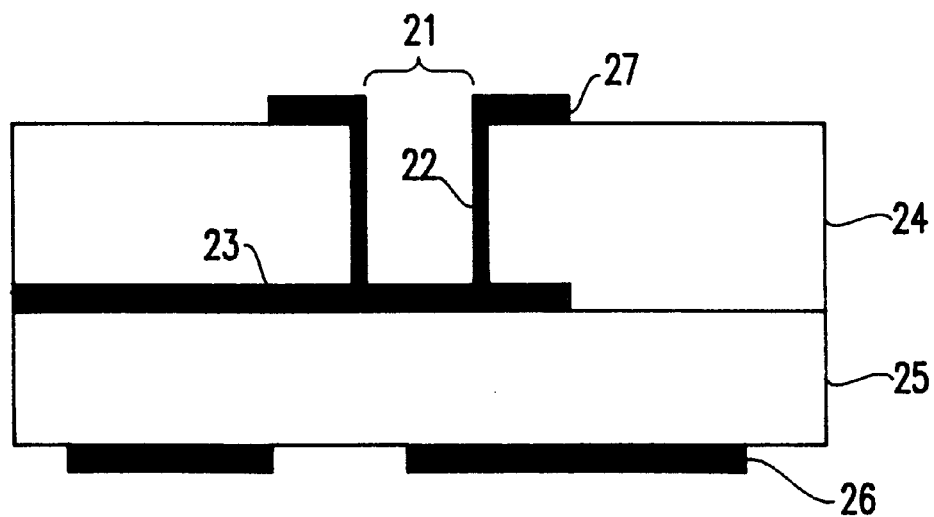
FIG. 1C is a schematic cross sectional view of a buried via.
Figure 2A:
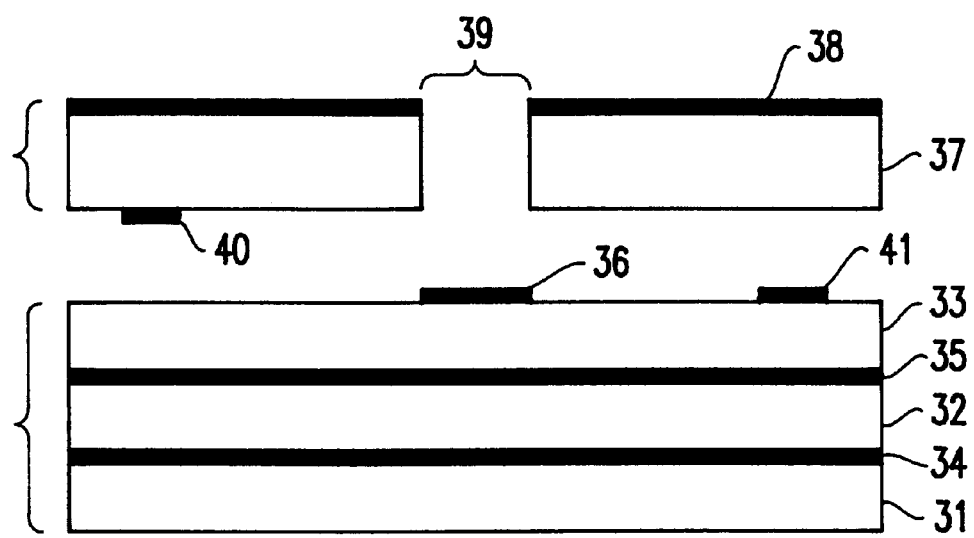
FIG. 2A is a schematic cross sectional view of a preliminary step in forming a blind via by the method of the present invention.
Figure 2B:
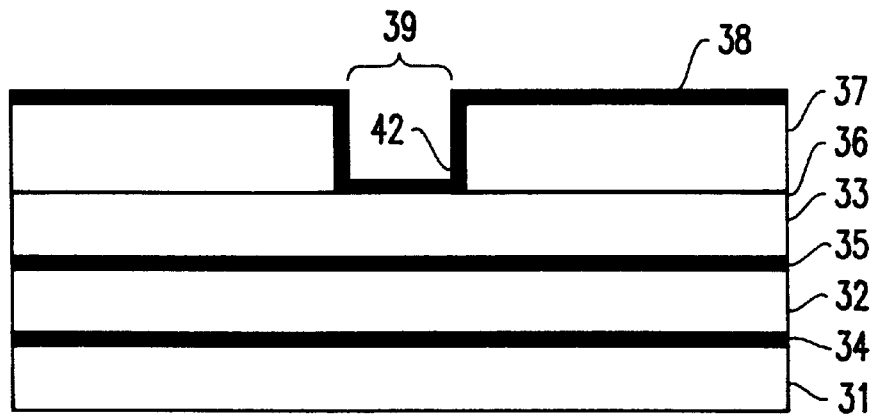
FIG. 2B is a schematic cross sectional view of of the final step of forming a blind via by the method of present invention.

Referring now to the drawings, and more particularly to FIGS. 2A and 2B, there is shown the formation of a blind via by the method of the present invention. In FIG. 2A there is shown three insulative layers 31, 32, 33. Between insulative layer 31 and insulative layer 32 is a conducting layer 34. The patterning of conducting layer 34 is not shown. There is another patterned conducting layer 35 between insulative layer 32 and 33. On top of insulative layer 33 is a patterned conductor layer 36 with some patterning shown (however, the complete patterning of layer 36 is not shown). Insulative layers 31, 32, 33 may have vias (not shown) to make connections between conducting layers.

An insulative layer 37 has patterned conducting layer 38 and a hole 39 drilled through. Layer 37 may be a single layer of dielectric material, or may be a partially completed printed circuit board with internal conductive layers. This layer 37 is to be laminated to insulative layer 33 matching the hole 39 to appropriate areas in the patterned conducting layer 36. Hole 39 may be plated prior to as well as after laminating 37 to 33 (FIG. 2A shows an embodiment where hole 39 is unplated at the time of lamination).

In the laminating process of this invention, the first layer, shown in FIG. 2A as a multilayer structure having layers 31, 32, and 33, may consist of a partially fabricated printed circuit board composed from dielectric material selected from the group consisting of polytetrafluoroethylene, polyimides, acrylics, polyesters, triazines, bismaleimides, and blends or composites thereof, reinforced by either woven or non-woven inorganic or organic fillers such as ceramics, glasses and aramids. The first layer can be processed using conventional printed circuit board fabrication methods.

The second layer in the laminating process of this invention, shown in FIG. 2A as layer 37, consists of materials from the same group set forth above, but with an additional restriction on their flow properties. If the dielectric material is thermoplastic, such as PTFE, then it must have sufficient viscosity at lamination conditions so that the hole 39 does not fill completely. If the dielectric material is thermosetting, it must be sufficiently b-staged (partially cured) so that its molecular weight, and thus its viscosity, has increased sufficiently to prevent hole 39 from filling in.

An example of a suitable thermoplastic dielectric material is Rogers 2800. This is a PTFE based material with silica particle filler. It is commercially available in the range of about 1 to 5 mils thickness. It is most suitable for use as the second layer (layer 37) when used in combination with the first layer (combination of layers 31, 32, and 33) that is also fabricated of Rogers 2800, because the high lamination temperature (365° C.) would degrade many of the materials that could otherwise be used for first layer. The second layer may be a single layer of dielectric, a copper clad layer of dielectric, or a partially fabricated printed circuit board. The second layer may or may not be pre-densified, and hole 39 may or may not be plated prior to lamination to layer 1.

A second example of a suitable material for the second layer is Hoechst Celanese Vectran LCP which is a thermoplastic liquid crystal polymer. It is commercially available in laminatable form for processing at approximately 240° C. Thus, the first layer could include all of the materials identified above that can tolerate 240° C. without degrading.

A third example of a suitable material for the second layer is Dupont Pyralux LF. This is a multi-layer dielectric material consisting of a polyimide core, coated on both sides with a b-staged thermosetting modified acrylic adhesive. The first layer may be constructed of any of the suitable dielectric materials identified above. Pyralux is available with its individual layer thicknesses ranging from 0.5 to 3 mils. The adhesive has very limited flow during lamination, so hole 39 will reduce 1 to 2 mils in diameter during lamination if the adhesive layer is 1 mil thick.

A fourth example of a suitable material for the first layer is Gore Speedboard C. Speedboard C is an expanded PTFE thermoplastic that is filled with a b-staged thermosetting resin. It is laminated at 225° C., and would be suitable for use with any of the first layer materials identified above that can tolerate 225° C. without degrading. Speedboard is also available with lower curing temperature resins.

A fifth example of a suitable material for the second layer is Arlon 49N which is a multi-functional epoxy resin reinforced with continuous woven glass fibers. It is a b-staged material, with its cure advanced to the extent that it is characterized as a no-flow material during lamination. The required lamination temperature is approximately 175° C., so it would be suitable for use with any of the first layer materials identified above that can tolerate 175° without degrading.

Although only one hole 39 is shown in FIG. 2A, additional holes may be drilled through depending on the connection requirements of each application.

Depending on the circuit requirements, conductor layers 40 and 41, that are not intersected by hole 39, can be formed prior to laminating insulative layer 37 to insulative layer 33.

FIG. 2B shows a schematic cross sectional view of the structure after laminating and plating. As can be seen, after lamination hole 39 is plated with conductor 42. More layers can be added to the structure by the same method.

This invention for making blind vias eliminates the problems of controlling drill depth during hole making. It is applicable to high performance PTFE based dielectric materials, and other thermoplastic dielectric layers; as well as a variety of B-staged thermoset dielectrics, and composites thereof.

Figure 3:
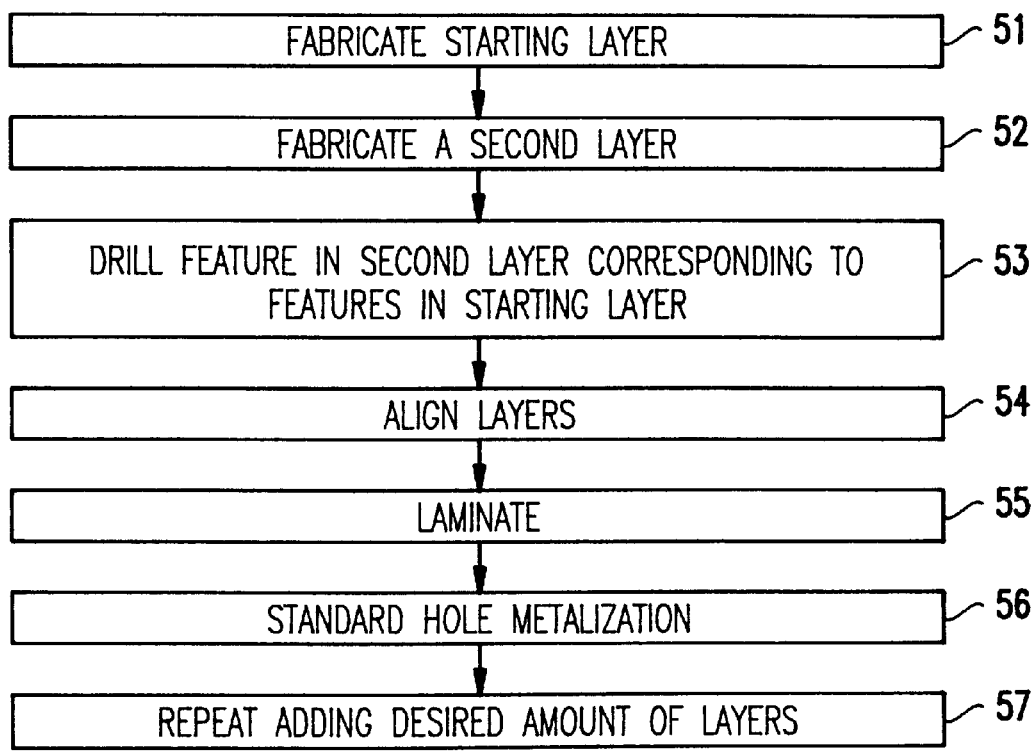
FIG. 3 is a flow chart showing the steps of the present invention.

FIG. 3 is a flow chart of the steps of the present invention. As can be seen in the step shown in block 51, a first or starting layer is fabricated as a circuit board core. This layer may consist of, for example, Rogers 2800 dielectric with circuitized copper on one or both sides. It may also consist of a partially completed printed circuit board with internal conductors (not shown). A multi-layer composite could be substituted instead. Next, as shown in block 52, a second layer is fabricated of Rogers 2800 (or other suitable material) clad with conductor on one side. This could accomplished by laminating the 2800 with ½ ounce layer of copper on one side. Then, in the step shown block 53, the second layer is drilled with fiducials or alignment features that correspond to the first or starting layer. In addition, holes are drilled in the second layer to form what will become the blind vias. Because minimal handling and no wet processing is required to do the drill operation, even very thin insulative layers (1 mil) could be used. There is little risk of stretching or damaging the second layer in a stack drill operation.

As shown in the step shown in block 54, the second layer is now aligned (either mechanically or optically) on top of the first layer in such a way that the drilled holes of second layer align with the lands of pads on the first layer. The next step is lamination. The resulting structure now has blind holes that terminate at contact pads on the first layer. Because the second layer may be conductor clad and predensified, very little dimensional change occurs during lamination. These blind holes will be smaller than the original drill size (about 50% if the Rogers 2800 is not previously densified; about 10% if it was predensified). After alignment, the layers are laminated as shown in the step of block As shown in the step of block 56, the blind vias are plated by standard hole metalization. In the case of 2800, this would include plasma, forming gas, pre-clean, seed, electroless Copper, and acid copper plating. A photo process step could be added to pattern plate circuits onto the top layer simultaneously. The next step as shown in the block 57, is to repeat the previously discussed steps until the desired amount of layers is achieved. Repeating the process would create buried vias. In addition, the vias could be stacked or be overlapping.

The novelty of this approach derives from the fact that the holes are drilled prior to lamination. This approach works because the insulative material are selected that have limited flow during lamination. Existing art for making blind vias, by contrast, has been developed for fully cured thermosetting materials which cannot be re-laminated together. The previous attempts to make blind vias have always followed the same general approach as those used for fully cured thermosets, except for those techniques using photoimageable materials that were described above in the background section.

There is additional novelty in this invention in the way that the dimensional stability of the laminate (e.g., Rogers 2800) is controlled by predensifying and cladding it before drilling. While the dielectric could be drilled without first densifying and cladding, the best dimensional control would not be obtained. Furthermore, cladding is desired to form a layer for plating the holes.

The utility of this invention is that it makes the manufacturing of blind and buried vias much easier and cheaper. Blind and buried vias are traditionally used to increase packaging density, and in the case of high frequency microwave application, blind and buried vias may be required for tuning the circuitry. High frequency electrical signal propagation is more sensitive to geometrical details than lower frequency signals.

The basic process steps laid out in this invention can be extended to create various structures of blind vias, overlapping vias, and stacked vias. Suitable materials have already been identified in the foregoing examples.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A method of forming a multiple layered structure having connections between multiple layers of wiring, comprising the steps of:

providing a first insulative layer having a patterned conducting layer formed on at least one side;

providing a second insulative layer having at least one hole drilled therethrough, said second insulative layer being selected from the group consisting of thermoplastics and partially cured thermosets having sufficient viscosity at lamination to prevent said hole from being filled during lamination; then aligning said hole in said second insulative layer to said pattened conducting layer on said first insulative layer; then laminating said first and second insulative layers together by curing; and metalizing said hole in said second layer after said lamination step, said metalizing step creating an electrical connection with said patterned conducting layer on said first insulative layer.

2. The method of claim 1 wherein said first insulative layer is a partially completed printed circuit board with patterned conductors on internal and external dielectric layers.

3. The method of claim 2 wherein said internal and external dielectric layers are comprised of materials selected from the group consisting of polyimides, acrylics, polytetrafluoroethylene, epoxies, triazines, bismaleimides, and blends thereof, and wherein said materials are reinforced by materials selected by the group consisting of woven or non-woven organic or inorganic fillers.

4. The method of claim 1 wherein said second insulative layer is a partially completed printed circuit board with patterned conductors on internal and external dielectric layers.

5. The method of claim 4 wherein said internal and external dielectric layers are comprised of materials selected from the group consisting of polyimides, acrylics, polytetrafluoroethylene, epoxies, triazines, bismaleimides, and blends thereof, and wherein said materials are reinforced by materials selected by the group consisting of woven or non-woven organic or inorganic fillers.

6. The method of claim 1 further comprising step of repeating said two providing, said aligning, and said laminating steps multiple times.

7. The method of claim 1 wherein said second insulative layer is comprised of a thermoplastic polymer dielectric material selected from the group consisting of fluorinated polymers, polyesters, and polyimides, reinforced by either woven or non-woven inorganic or organic fillers.

8. The method of claim 7 wherein said woven or non-woven inorganic or organic fillers are selected from the group consisting of ceramics, glasses, and aramids.

9. The method claim 7 wherein said second insulative layer is comprised of a thermosetting polymer dielectric material that is partially cured by b-staging.

10. The method as in claim 1 wherein said first providing step includes the step of patterning said patterned conducting layer, said patterning being performed by electroless or electrolytic copper plating, sputter deposition, or evaporative deposition.

11. The method as in claim 1 wherein said patterned conducting layer is comprised of a metal or metal alloy selected from the group consisting of copper, palladium, aluminum, copper-nickel-iron alloy-copper, gold, tin, nickel, lead, silver, nickel-iron alloy, cresot-lore, and combinations thereof.

12. The method as in claim 1 wherein said first providing step includes the step of patterning said patterned conducting layer, said patterning being performed by subtractive etching.

13. The method as in claim 1 wherein said step of aligning is performed mechanically.

14. The method as in claim 1 wherein said step of aligning is performed optically.

* * * * *